(12) United States Patent
Na

(10) Patent No.: US 6,255,870 B1
(45) Date of Patent: Jul. 3, 2001

(54) APPARATUS FOR COMPENSATING LOCKING ERROR IN HIGH SPEED MEMORY DEVICE WITH DELAY LOCKED LOOP

(75) Inventor: Kwang-Jin Na, Ichon (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/474,093

(22) Filed: Dec. 29, 1999

(30) Foreign Application Priority Data

Dec. 30, 1998 (KR) .................................................. 98-61094

(51) Int. Cl.[7] .................................................. H03L 7/00
(52) U.S. Cl. .................................................. 327/149; 327/161
(58) Field of Search .................................................. 327/145, 146, 327/147, 149, 152, 153, 161, 162, 163; 375/371

(56) References Cited

U.S. PATENT DOCUMENTS

| 4,109,100 | 8/1978 | Unkauf ................................ 178/67 |
| 5,440,514 | 8/1995 | Flannagan et al. .................. 365/194 |
| 5,604,468 | 2/1997 | Gillig .................................... 331/176 |
| 5,953,534 | 9/1999 | Romer et al. ........................ 395/712 |
| 6,140,854 | * 10/2000 | Coddington et al. ................. 327/158 |

FOREIGN PATENT DOCUMENTS

| 08147967 | 6/1996 | (JP) | ............................ G11C/11/403 |
| 08167890 | 6/1996 | (JP) | ................................ H04L/7/02 |
| 09017179 | 1/1997 | (JP) | ............................ G11C/11/407 |
| 10285016 | 10/1998 | (JP) | ................................ H03L/7/00 |
| 10336008 | 12/1998 | (JP) | ........................ H03K/19/0175 |
| 11065669 | 3/1999 | (JP) | ................................ G06F/1/10 |
| 11066847 | 3/1999 | (JP) | ............................ G11C/11/407 |
| 11086545 | 3/1999 | (JP) | ............................ G11C/11/407 |
| 11120768 | 4/1999 | (JP) | ............................ G11C/11/407 |
| 11126479 | 5/1999 | (JP) | ............................ G11C/11/407 |
| 11145816 | 5/1999 | (JP) | ........................ H03K/19/0175 |
| 11004147 | 6/1999 | (JP) | ............................ H03K/5/135 |

* cited by examiner

*Primary Examiner*—Toan Tran
*Assistant Examiner*—Linh Nguyen
(74) *Attorney, Agent, or Firm*—Jacobson, Price, Holman & Stern, PLLC

(57) ABSTRACT

An apparatus for compensating a locking error in a high speed memory device includes a division unit for dividing a buffered external clock signal into a first clock signal, a second clock signal, and a third clock signal having twice the low level width of the second clock signal, a selection unit for selecting one of the second clock signal and the third clock signal in response to a first control signal, a delay unit for delaying the first clock signal and gradually increasing a time delay in response to a second control signal, a unit for delaying the delayed first clock signal according to a modeling of a delay time to generate a fourth clock signal, an initial clock control unit for generating the first control signal, and a phase comparison unit for comparing the fourth clock signal and an output signal of the selection unit to generate the second control signal, thereby compensating an unlock error.

5 Claims, 9 Drawing Sheets

APPARATUS FOR COMPENSATING LOCKING ERROR IN HIGH SPEED MEMORY DEVICE WITH DELAY LOCKED LOOP

FIELD OF THE INVENTION

The present invention relates to a delay locked loop (DLL); and, more particularly, to an apparatus for compensating a locking error in a high speed memory device using a delay locked loop (DDL).

DESCRIPTION OF THE PRIOR ART

In generally, a delay lock loop (hereinafter, referred to as a DLL) is a clock recovery circuit for correctly synchronizing a data output, which is outputted from a memory core through an input/output line, with that of an external clock. As shown in FIG. 1 showing a block diagram of a register-controlled digital DLL, after buffering an external clock through a clock buffer 1, the buffered clock signal CLK_BUF is divided into several divided clock signals including a first divided clock signal CLK_DIV and a second divided clock signal CLK_COM2 through a ⅛ divider 5. Hereinafter, the second divided clock signal CLK_COM2 is referred to as a second comparing clock signal. A first delay unit 6 receives the first divided clock signal CLK_DIV to generate a delayed clock CLK_DLY. A delay monitor 7 having a modeling of delay value corresponding to a sum of respective delay times of a clock buffer 1, an output buffer 3 and I/O line 4 receives the delayed clock signal CLK_DLY to generate a first comparing clock signal CLK_COM1. Additionally, a phase comparator 8 compares the first comparing clock signal CLK_COM1 and the second comparing clock signal CLK_COM2 to generate an output signal PC_OUT to a shift control unit 9. Meanwhile, the buffered clock signal CLK_BUF from the clock buffer 1 is inputted into a second delay unit 2 and is outputted through an output buffer 3 to an I/O line 4. Consequently, the output data outputted from the I/O line 4 is synchronized with the external clock signal. At this time, the shift control unit 9 controls the first and second delay units 2 and 6 according to the output signal PC_OUT of the phase comparator 8 and consequently, a DLL clock having a predetermined time delay is generated. That is, a time delay TD_DLY of the first delay unit 6 is gradually increased from a minimum time delay until each phase of the two clock signals CLK_13 COM1 and CLK_COM2 inputted into the phase comparator 8 is correctly synchronized with each other. FIG. 2 is a clock timing chart illustrating a lockable initial operation of the DLL. As shown in FIG. 2, at an initial operation of the DLL, a rising edge of the first comparing clock signal CLK_COM1 should exist within a low level width Tcyc of the second comparing clock signal CLK_COM2. That is, the phase of the first comparing clock signal CLK_COM1 is delayed by gradually increasing the time delay TD_DLY of the first delay unit 6, to thereby synchronizing the rising edge of the first comparing clock signal CLK_COM1 with that of the second comparing clock signal CLK_COM2.

FIG. 3 is a clock timing chart illustrating an initial operation of the DLL with a locking error. As shown in FIG. 3, at an initial clock timing, the phase comparator 8 generates a control signal to precede the phase of the first comparing clock signal CLK_COM1, not to delay it. Accordingly, since the first delay unit 6 can not make the delay less than the initial minimum delay, there has been an unlock problem that the first comparing clock signal CLK_COM1 can not be synchronized with the second comparing clock signal CLK_COM2. As the initial time delay TD_DLY of the first delay unit 6 and the time delay TD_MON of the delay monitor 7 are increasing and the low level width Tcyc of the second comparing clock signal CLK_COM2 are decreasing, such an unlock problem will be greatly increased.

SUMMARY OF THE INVENTION

It is, therefore, an object of the present invention to provide a DLL and more particularly, to an apparatus for compensating a locking error in a high speed memory device using the DLL.

In accordance with an aspect of the present invention, there is provided an apparatus for compensating a locking error in a high speed memory device using a DLL circuit, comprising: a division means for dividing a buffered external clock signal into a plurality of divided clock signals having respective pulse widths, wherein the plurality of the divided clock signals include a first clock signal, a second clock signal corresponding to an inverted first clock signal, and a third clock signal having a low level width twice as wide as that of the second clock signal; a selection means for selecting one of the second clock signal and the third clock signal in response to a first control signal; a delay means for delaying the first clock signal and gradually increasing a time delay in response to a second control signal; a means for receiving and delaying the delayed first clock signal according to a modeling of a delay time to generate a fourth clock signal, wherein the modeling of the delay time corresponds to a delay time from a clock buffer for buffering the external clock signal to an output unit for outputting an internal data; an initial clock control means for generating the first control signal, wherein the first control signal is allowed to select the second clock signal by the selection means in case when a rising edge of the fourth clock signal is disposed within a low level width of the second clock signal, and wherein the first control signal is allowed to select the third clock signal by the selection means in case when a rising edge of the fourth clock signal is disposed outside a low level width of the second clock signal; and a phase comparison means for comparing the fourth clock signal and an output signal of the selection means to generate the second control signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
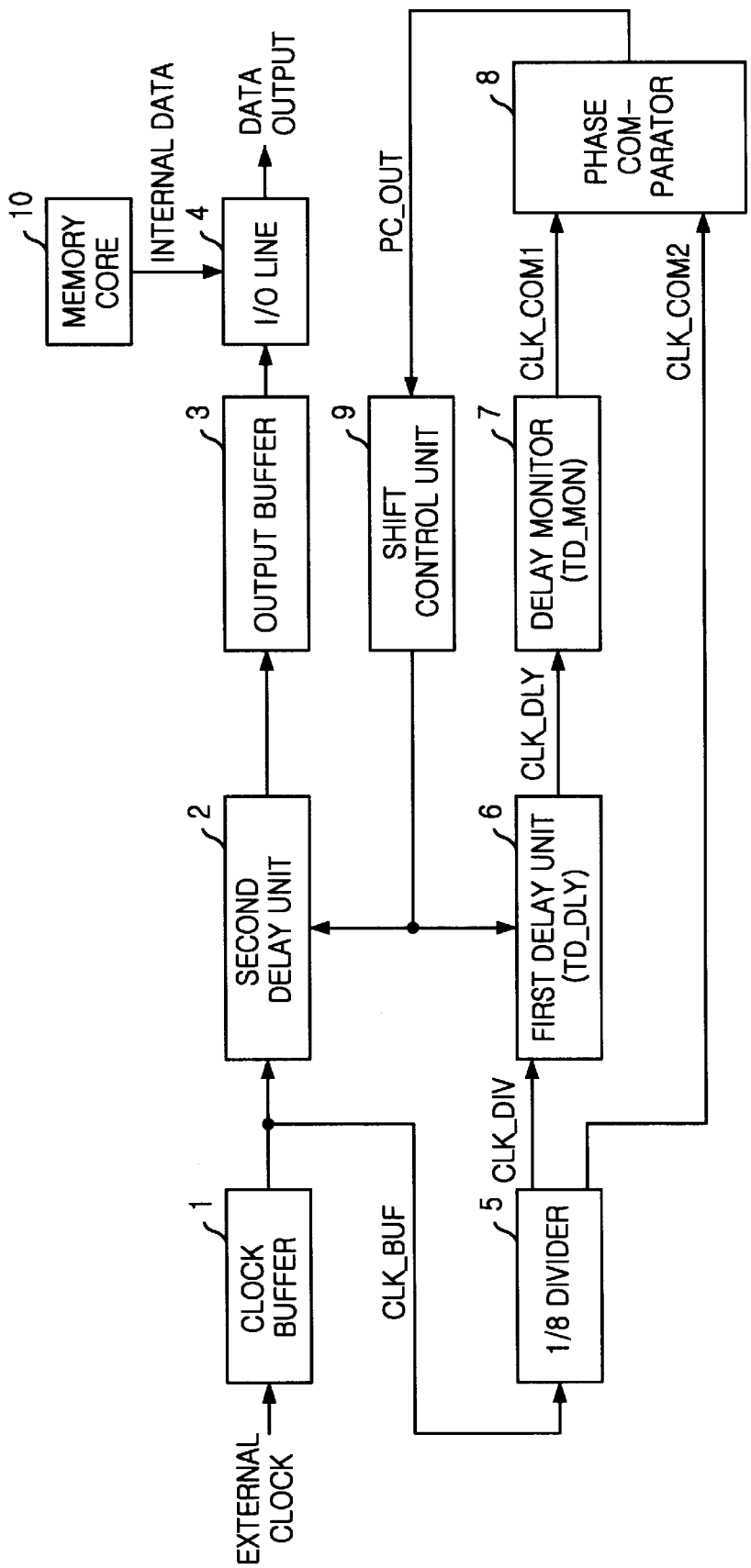
FIG. 1 is a block diagram illustrating a register-controlled digital DLL.
Figure 2:
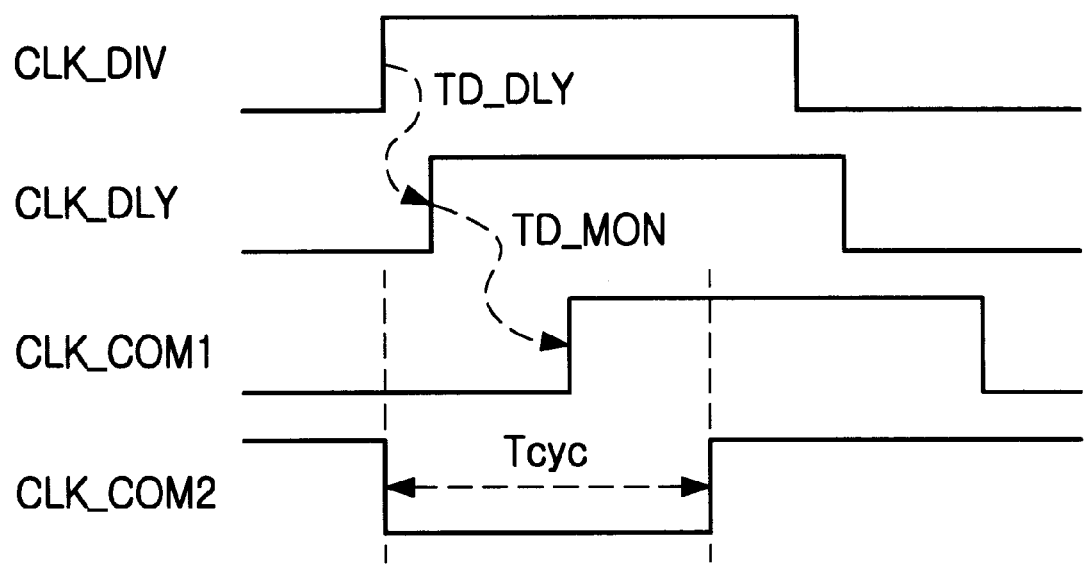
FIG. 2 is a clock timing chart illustrating a lockable initial operation of DLL.
Figure 3:
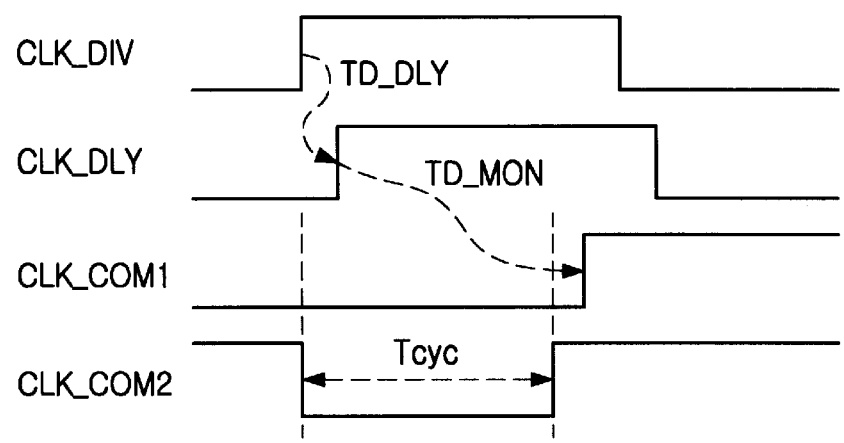
FIG. 3 is a clock timing chart illustrating an initial operation of DLL with a locking error.

An entire DLL circuit according the present invention is the same as the prior art except a ⅛ divider. That is, the ⅛ divider is modified to provide an unlock compensator for compensating an unlock error. The same reference numerals as FIG. 1 represent the same units and signals as FIG. 1. The unlock compensator according to the present invention generates an additional third comparing clock signal as well as a second comparing clock signal having a predetermined low level width (Tcyc), wherein the third comparing clock signal has twice the low level width (i.e., 2×Tcyc) of the second comparing clock signal.

Figure 4:
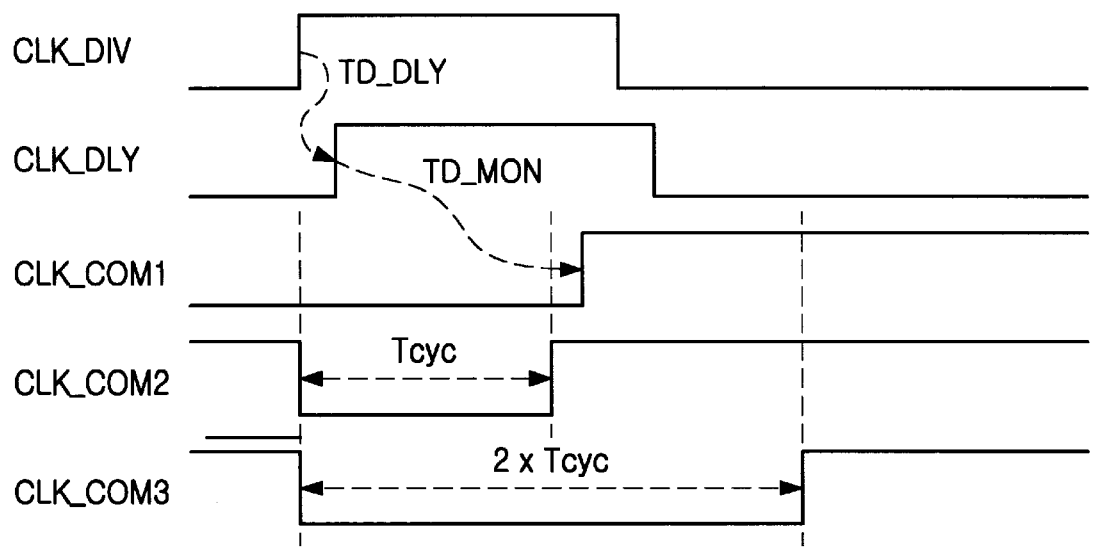
FIG. 4 is a timing chart for explaining a concept of an unlock compensator according to the present invention.

FIG. 4 is a timing chart for explaining a concept of the unlock compensator according to the present invention.

Referring to FIG. 4, at the initial operation of the DLL, the second comparing clock signal CLK_COM2 is inputted into the phase comparator 8 and then a determination is made as to whether it is possible to lock the clock signals according to a control signal as an output signal of the phase comparator 8. In case where it is determined to be the locking error, the third comparing clock signal CLK_COM3 is generated instead of the second comparing clock signal CLK_COM2. Then, the phase comparator 8 generates a control signal to increase the time delay TD_DLY of the first delay unit 6 until the rising edge of the first comparing clock signal CLK_COM1 is synchronized with that of the third comparing clock signal CLK_COM3. Using that principle, the unlock error, or a lock problem, can be effectively solved.

Figure 5:
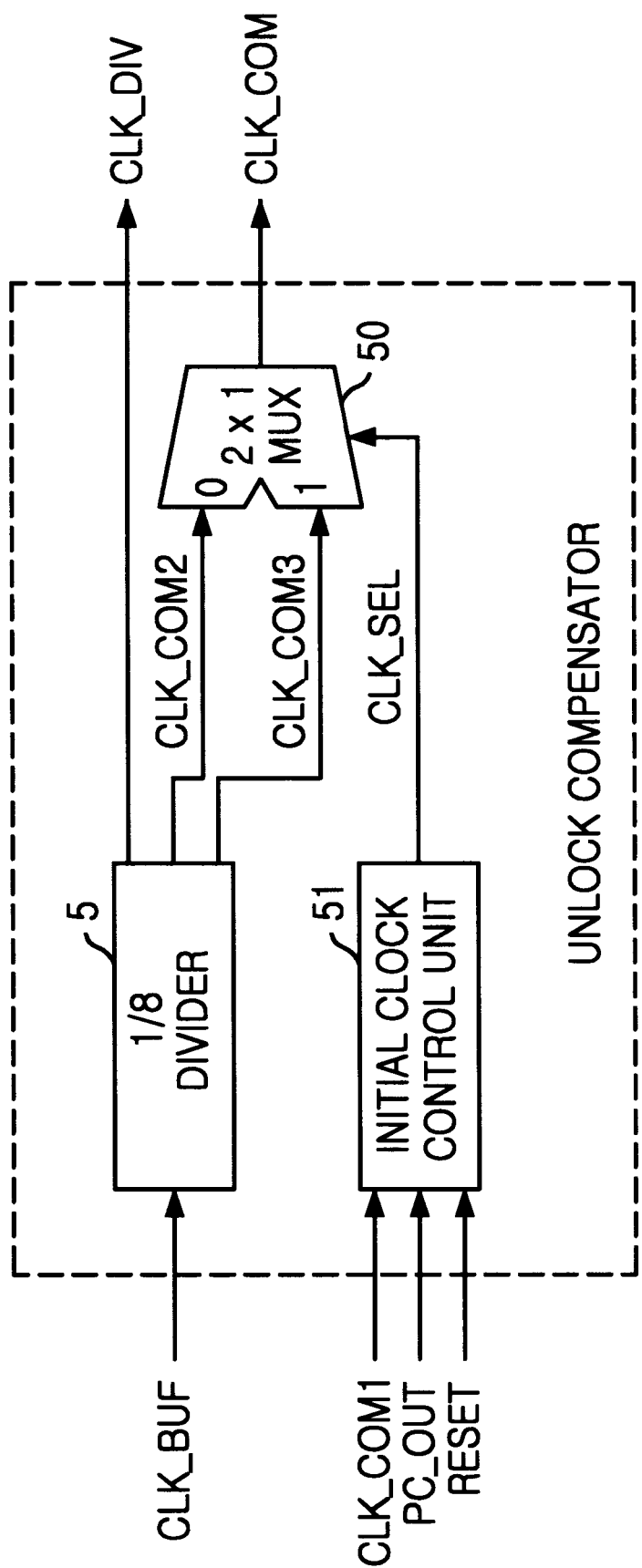
FIG. 5 is a block diagram illustrating an unlock compensator according to the present invention.

FIG. 5 is a block diagram illustrating an unlock compensator having an additional initial clock control unit according to the present invention.

Referring to FIG. 5, the unlock compensator includes a ⅛ divider 5 for generating a first divided clock signal CLK_DIV, a second comparing clock signal CLK_COM2 and a third comparing clock signal CLK_COM3, and a 2×1 multiplexer 50 for selectively outputting one of the second comparing clock signal CLK_COM2 and the third comparing clock signal CLK_COM3 to the phase comparator 8 in response to a select signal CLK_SEL. In addition, an initial clock control unit 51 receives the first comparing clock signal CLK_COM1, an output signal PC_OUT of the phase comparator 8 and a reset signal RESET to generate a control signal CLK_SEL as the select signal of the 2×1 multiplexer 50.

Figure 6:
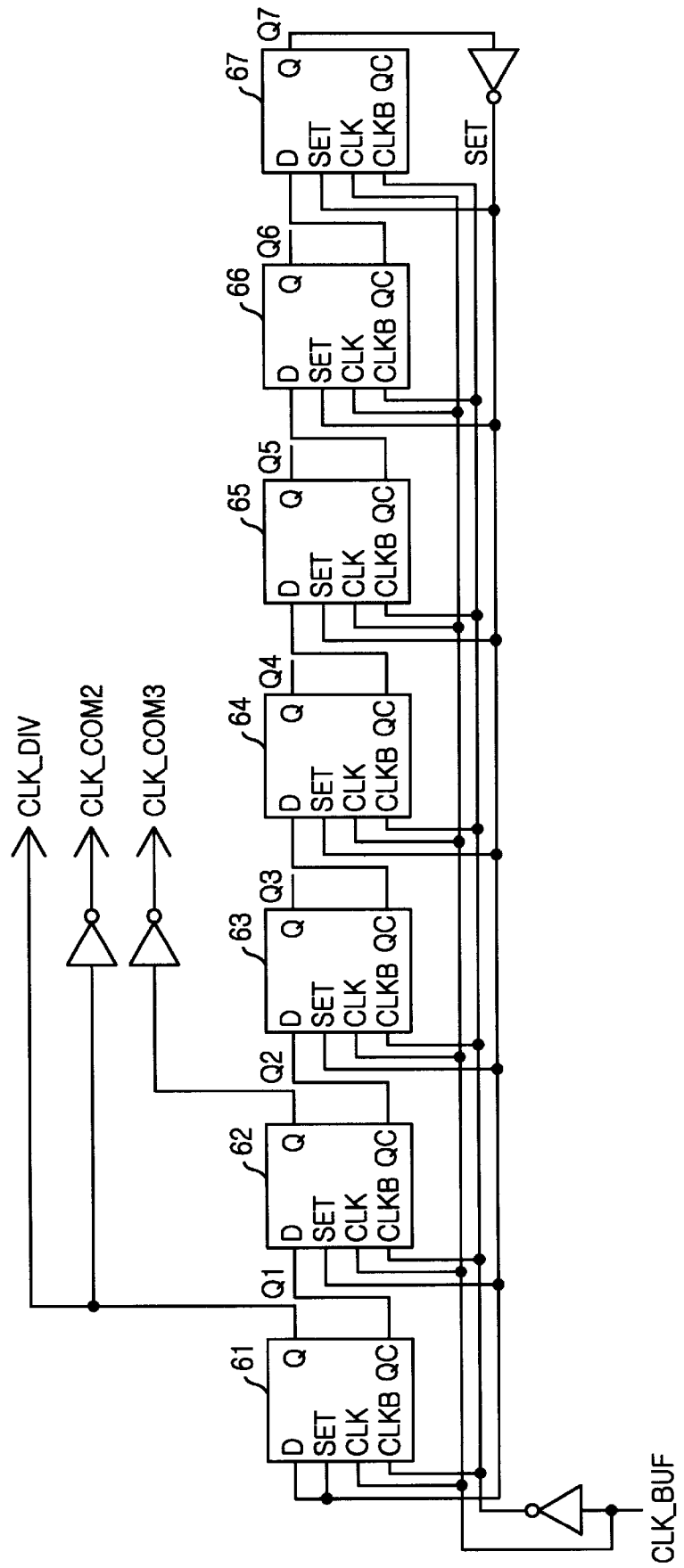
FIG. 6 is a circuit diagram illustrating a ⅛ divider according to the present invention.

FIG. 6 is a circuit diagram illustrating a ⅛ divider according to the present invention. As shown in FIG. 6, the ⅛ divider includes a plurality of D flip-flops 61 to 67, and each of the D flip-flops has a D input and two outputs, i.e., Q and QC. Each of the D flip-flops is connected in cascade, with the QC output of one D flip-flop connected to the D input of the next flip-flop, the CLK terminal of each D flip-flop receiving the clock signal CLK_BUF from the clock buffer 1 and the CLKB terminal of each D flip-flop receiving an inverted signal of the clock signal CLK_BUF. Further, a Q output of a rightmost D flip-flop 67 is inverted and the inverted signal is inputted to a D input of a leftmost D flip-flop 61 and each set terminal of the D flip-flops 61 to 67.

The first divided clock signal CLK_DIV is generated at a Q output of the leftmost D flip-flop 61, the second comparing clock signal CLK_COM2 is obtained by inverting the first divided clock signal CLK_DIV, and the third comparing clock signal CLK_COM3 is obtained by inverting a Q output of a D flip-flop 62 next to the leftmost D flip-flop 61.

Figure 7:
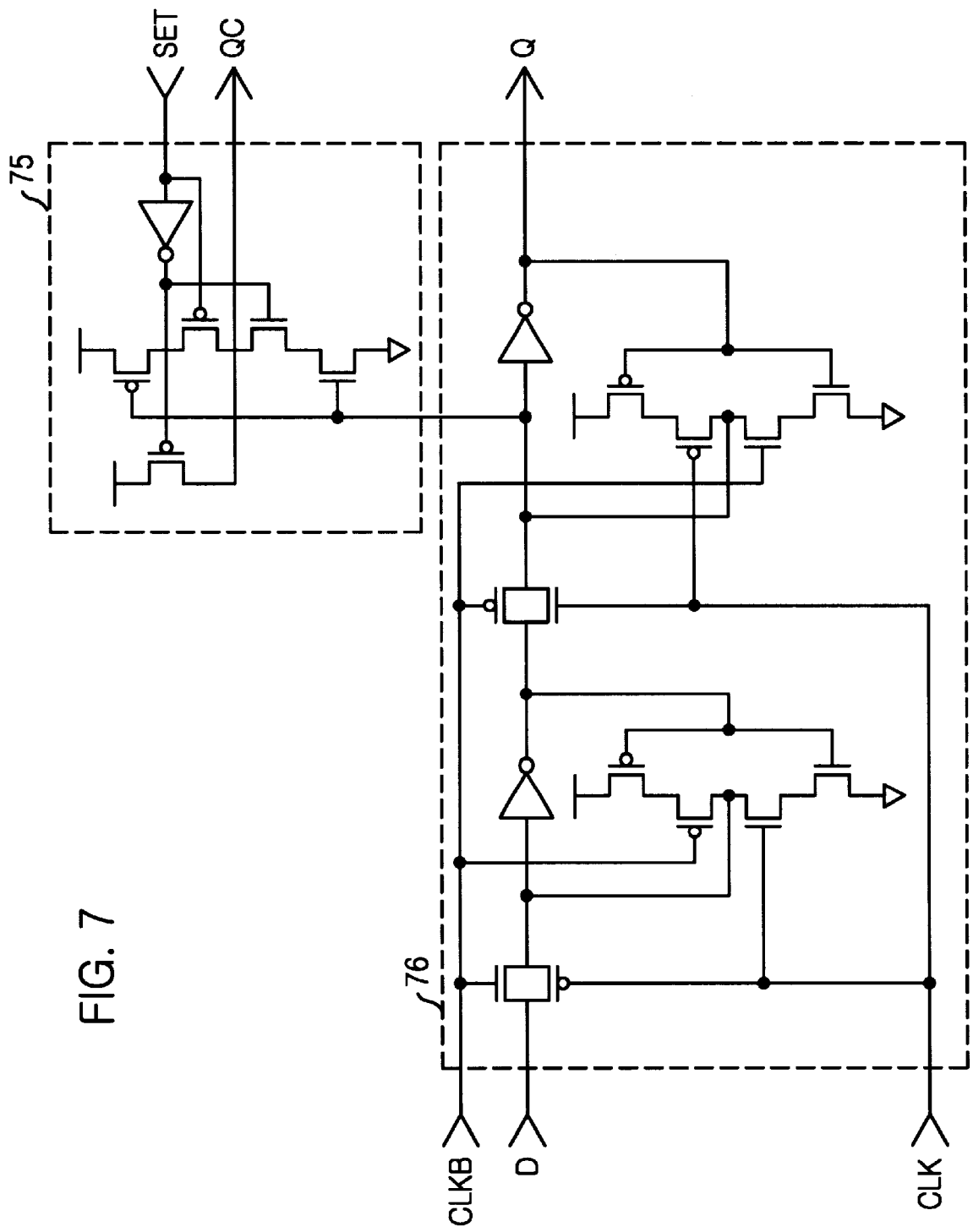
FIG. 7 is a circuit diagram illustrating a D flip-flop for constituting a ⅛ divider shown in FIG. 6.

FIG. 7 is a circuit diagram illustrating a D flip-flop shown in FIG. 6. As shown in FIG. 7, a set signal SET is only inputted into a QC output unit 75, not a Q output unit 76. In such a flip-flop including a plurality of NMOS and PMOS transistors and a plurality of inverters, the QC output is high when the set signal SET is high, and a QC output is equal to the Q output when the set signal SET is low.

Figure 9:
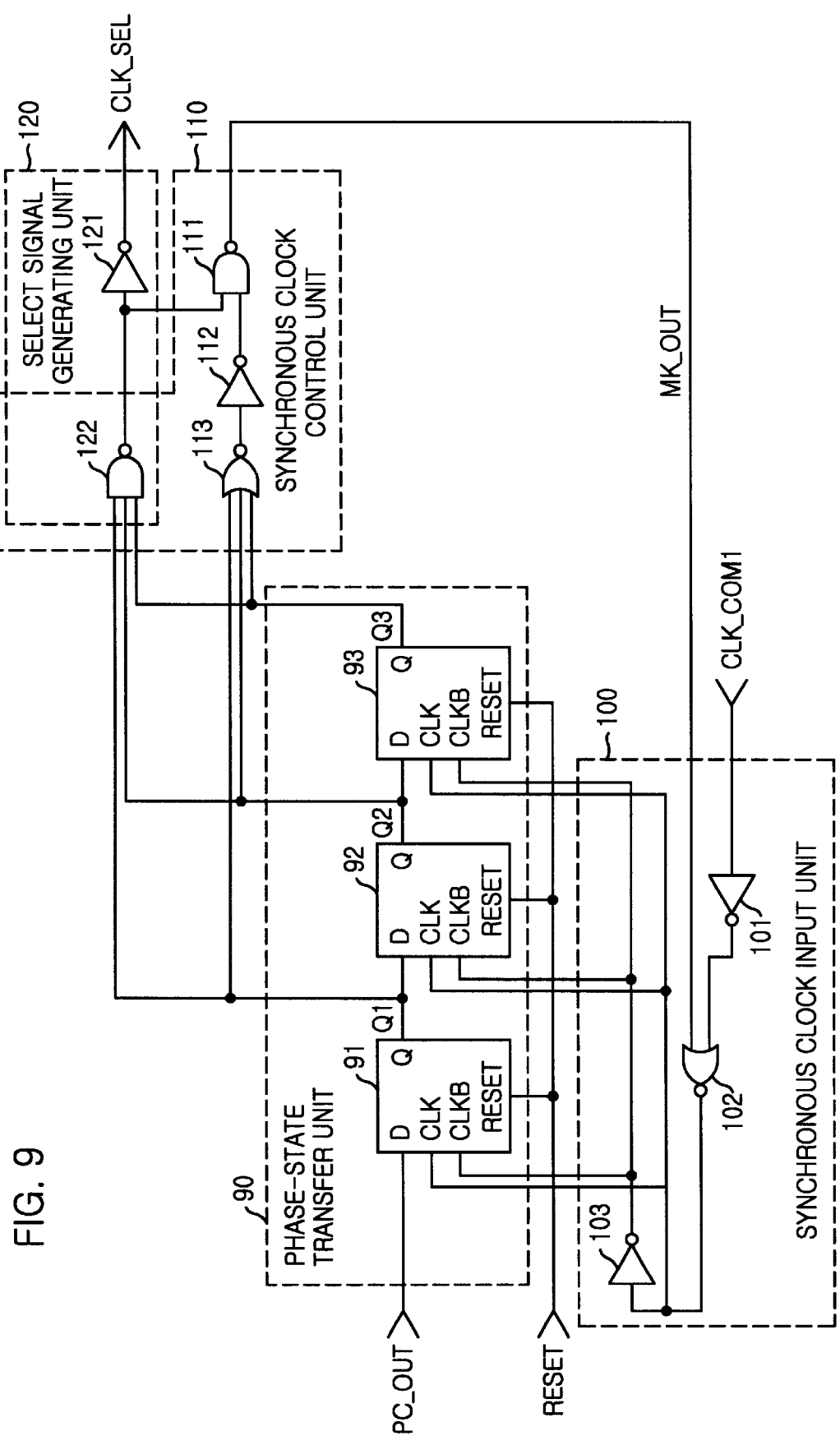
FIG. 9 is a circuit diagram illustrating an initial clock control unit shown in FIG. 5.

FIG. 9 is a circuit diagram illustrating an initial clock control unit shown in FIG. 5. As shown in FIG. 9, the initial clock control unit 51 having a plurality of flip-flops, inverters, NAND gates and NOR gates includes a phase-state transfer unit 90, a synchronous clock input unit 100, a synchronous clock control unit 110 and a select signal generating unit 120.

The phase-state transfer unit 90 includes three D flip-flops 91 to 93. At an initial reset operation, the Q1, Q2 and Q3 outputs of the D flip-flops 91, 92 and 93 is initialized to be high, low and low, respectively. The phase-state transfer unit 90 receives the output signal PC_OUT of the phase comparator 8 and transfers the output signal PC_OUT to the Q1, Q2 and Q3 outputs one another in synchronization with a clock signal from the synchronous clock input unit 100. Then, when the output signal PC_OUT is kept on a low level, i.e., a lockable state, all of the Q1, Q2 and Q3 outputs become low after three clocks. On the contrary, when the output signal PC_OUT is kept on a high level, i.e., a state of locking error, all of the Q1, Q2 and Q3 outputs are high after two clocks.

In the select signal generating unit 120, the Q1, Q2 and Q3 outputs are NANDed by a NAND gate 122 and then inverted by an inverter 121, thereby generating a control signal CLK_SEL to the 2×1 multiplexer 50. The select signal generating unit 120 generates the control signal CLK_SEL of a low level, and then generates the control signal CLK_SEL of a high level only when all of the Q1, Q2 and Q3 outputs are high, i.e., at the state of the locking error.

The synchronous clock control unit 110 includes a NOR gate 113 for NORing the Q1, Q2 and Q3 outputs, an inverter 112 for inverting an output of the NOR gate 113, and a NAND gate 111 for NANDing an output of the NAND gate 122 and an output of the inverter 112. The synchronous clock control unit 110 determines whether the initial state is a locking error or not by using the output signal PC_OUT of the phase comparator 8. In case where all of the Q1, Q2 and Q3 outputs are low or high, a control signal MK_OUT is set to be high.

The synchronous clock input unit 100 includes an inverter 101 for inverting the first comparing clock signal CLK_COM1, a NOR gate 102 for NORing the control signal MK_OUT and an output signal of the inverter 101 to provide the NORed signal to the CLK terminals of the D flip-flops 91 to 93, and an inverter 103 for inverting an output signal of the NOR gate 102 to provide the inverted signal to the CLKB terminals of the D flip-flops 91 to 93. When the first comparing clock signal CLK_COM1 is inputted to the synchronous clock input unit 100 and the control signal MK_OUT is high, the clock signal inputted into the phase-state transfer unit 90 is kept in a low level state, so that the Q1, Q2 and Q3 outputs do not change.

Figure 8:
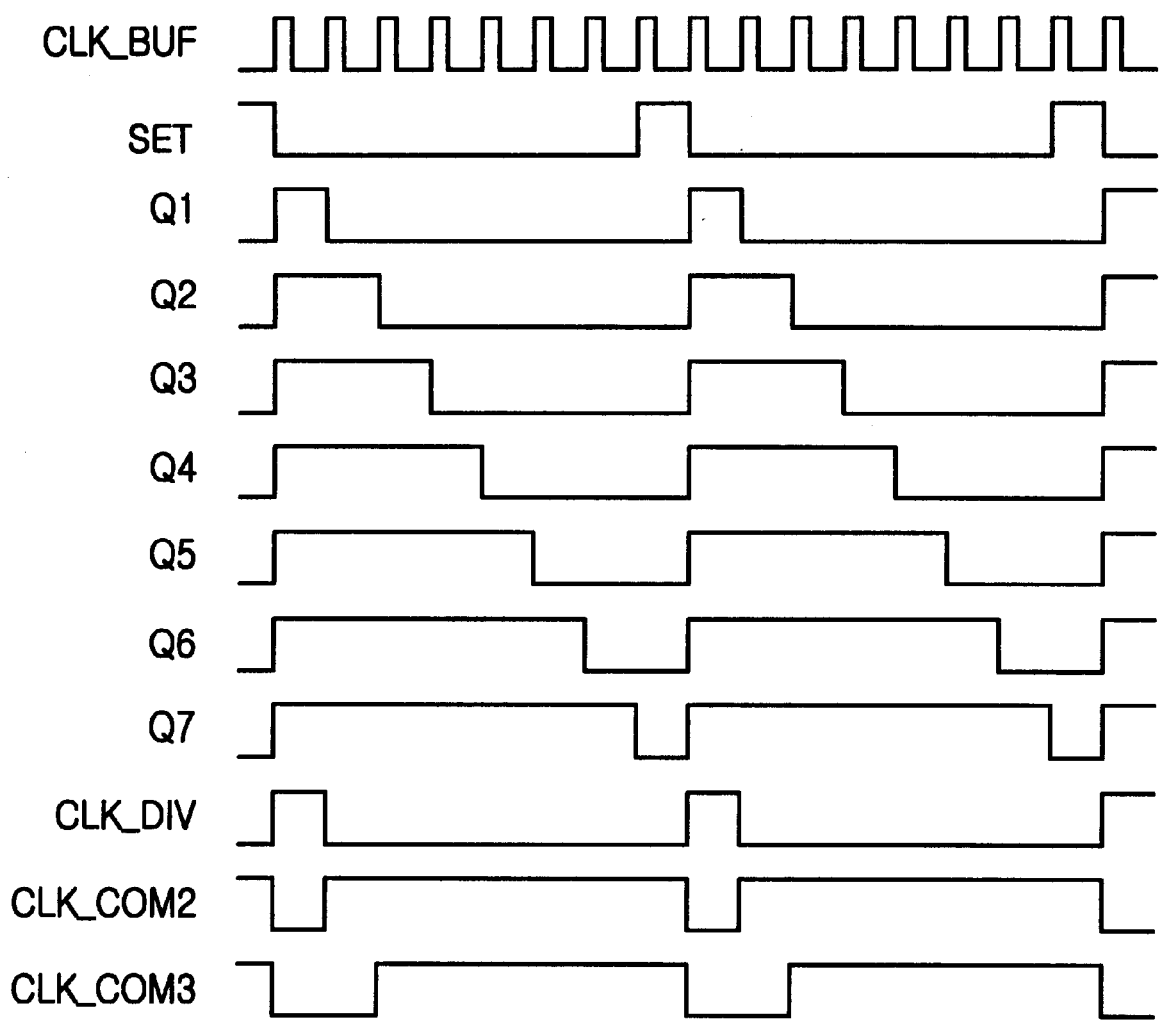
FIG. 8 is a timing chart illustrating a ⅛ divider shown in FIG. 6.

An operation of the unlock compensator having the ⅛ divider shown in FIG. 5 will be described with reference to FIG. 8.

Figure 10:
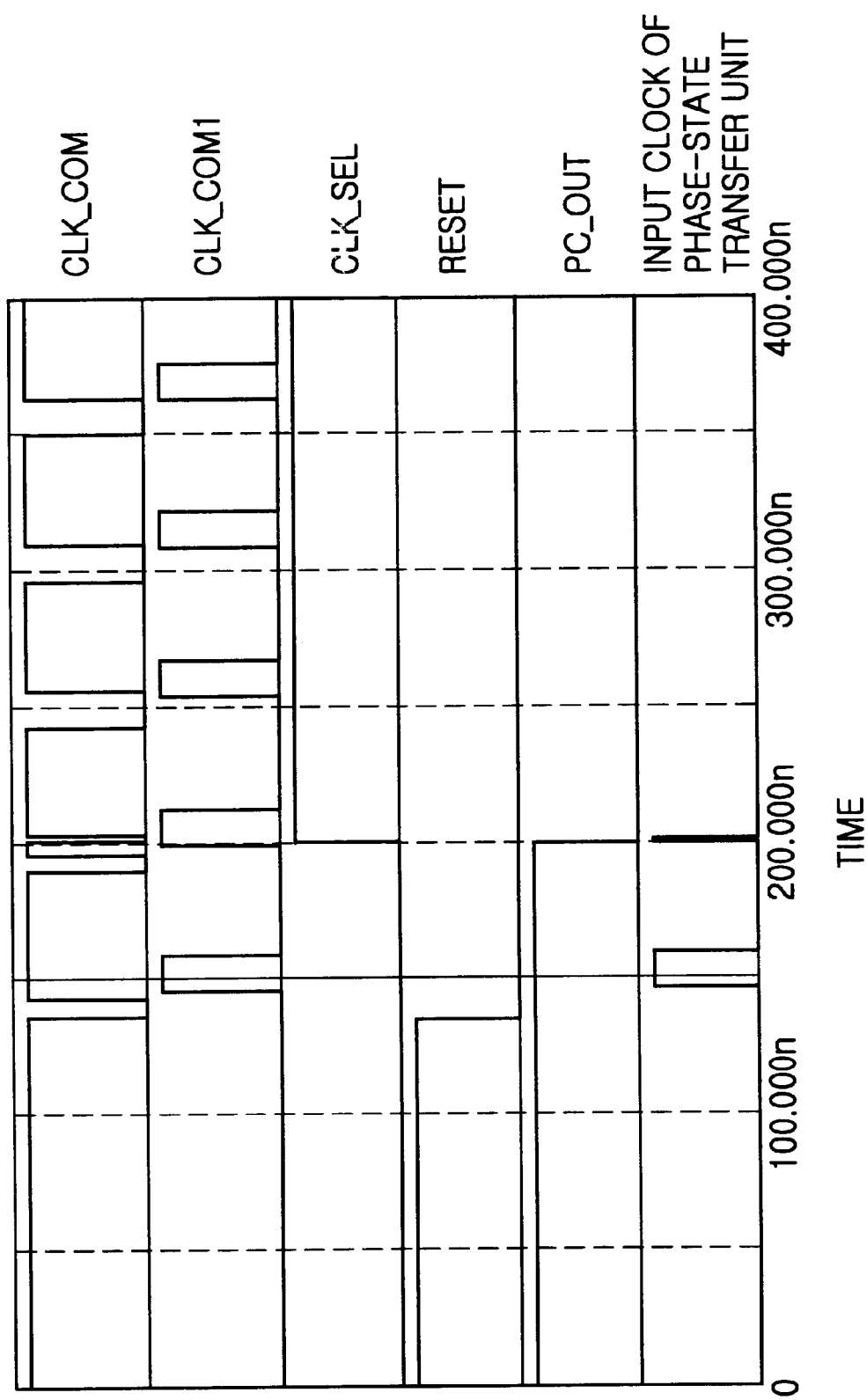
FIG. 10 is a timing chart illustrating clock signals and control signals in an unlock compensator.

The ⅛ divider generates the first divided clock signal CLK_DIV, the second comparing clock signal CLK_COM2 having a low level width of Tcyc, and the third comparing clock signal CLK_COM3 having a low level width of 2×Tcyc. At the reset operation, since the select signal CLK_SEL from the initial clock control unit 51 is low, the 2×1 mulitplexer 50 outputs the second comparing clock signal CLK_COM2 as the input clock of the phase comparator 8. After the reset operation, in case where the output signal PC_OUT of the phase comparator 8 is kept on a low level, the control signal CLK_SEL from the initial clock control unit 15 is low and the 2×1 multiplexer 50 outputs the second comparing clock signal CLK_COM2 as the input of the phase comparator 8. On the contrary, in case where the output signal PC_OUT is high, the control signal CLK_SEL from the initial clock control unit 15 is high and the 2×1 multiplexer 50 outputs the third comparing clock signal CLK_COM3 as an input of the phase comparator 8. The level of the control signal CLK_SEL is changed only at the initial DDL operation by the initial clock control unit 51. That is, the level of the control signal CLK_SEL is kept on one level until the initial clock control unit 51 is reset, and after completing the initial operation, the control signal CLK_SEL does not affect the DLL operation. FIG. 10 shows a timing chart illustrating clock signals and control signals in the unlock compensator described above.

While the present invention has been described with respect to certain preferred embodiments only, other modifications and variation may be made without departing from the spirit and scope of the present invention as set forth in the following claims.

What is claimed is:

1. An apparatus for compensating a locking error in a high speed memory device using a DLL, comprising:

a division means for dividing a buffered external clock signal into a plurality of divided clock signals having respective pulse widths, wherein the plurality of the divided clock signals include a first clock signal, a second clock signal corresponding to an inverted first clock signal, and a third clock signal having a low level width twice as wide as that of the second clock signal;

a selection means for selecting one of the second clock signal and the third clock signal in response to a first control signal;

a delay means for delaying the first clock signal and gradually increasing a time delay in response to a second control signal;

a means for receiving and delaying the delayed first clock signal according to a modeling of a delay value to generate a fourth clock signal, wherein the modeling of the delay value corresponds to a delay time from a clock buffer for buffering the external clock signal to an output unit for outputting an internal data;

an initial clock control means for generating the first control signal, wherein the first control signal is allowed to select the second clock signal by the selection means in case when a rising edge of the fourth clock signal is disposed within a low level width of the second clock signal, and wherein the first control signal is allowed to select the third clock signal by the selection means in case when a rising edge of the fourth clock signal is disposed outside a low level width of the second clock signal; and a phase comparison means for comparing the fourth clock signal and an output signal of the selection means to generate the second control signal.

2. The apparatus as recited in claim 1, wherein the initial clock control means includes:

a phase-state transfer means for transferring the output signals of the phase comparator in synchronization with a clock signal to generate a first, second and third output signals;

a synchronous clock generating means for providing a first synchronous clock signal and a second synchronous clock signal to the phase-state transfer means;

a select signal generating means for receiving the first, second and third output signals from the phase-state transfer means to generate the first control signal; and a synchronous clock control means for receiving the first, second and third output signals and the first control signal to control the synchronous clock signal.

3. The apparatus as recited in claim 2, wherein the select signal generating means includes:

a NAND gate for NANDing the first, second and third output signals; and an inverter for inverting the output signal of the first NAND gate to generate the first control signal.

4. The apparatus as recited in claim 3, wherein the synchronous clock control means includes:

a NOR gate for NORing the first, second ahd third output signals;

a second inverter for inverting an output signal of the NOR gate; and a second NAND gate for NANDing the output signal of the NAND gate and an output signal of the second inverter.

5. The apparatus as recited in claim 4, wherein the synchronous clock generating means includes:

a third inverter for inverting the fourth clock signal; and a third NAND gate for NANDing an output signal of the third inverter and an output signal of the synchronous clock control means.

* * * * *